(12) United States Patent
Corse et al.

(10) Patent No.: US 7,817,980 B2
(45) Date of Patent: Oct. 19, 2010

(54) RECEIVER FOR USE IN WIRELESS COMMUNICATIONS AND METHOD OF OPERATION OF THE RECEIVER

(75) Inventors: Nir Corse, Beer-Sheva (IL); Moshe Ben-Ayun, Shoham (IL); Ovadia Grossman, Tel Aviv-Affo (IL); Mark Rozental, Gedera (IL)

(73) Assignee: Motorola, Inc., Schaumburg, IL (US)

( * ) Notice: Subject to any disclaimer, the term of this patent is extended or adjusted under 35 U.S.C. 154(b) by 533 days.

(21) Appl. No.: 11/736,898

(22) Filed: Apr. 18, 2007

(65) Prior Publication Data

US 2007/0281647 A1    Dec. 6, 2007

(30) Foreign Application Priority Data

Apr. 28, 2006 (GB) ................. 0608363.8

(51) Int. Cl.
H04B 1/26 (2006.01)
(52) U.S. Cl. .................... 455/324; 455/260; 455/234.1; 375/345
(58) Field of Classification Search .............. 455/182.3, 455/183.1–183.2, 184.1, 192.1–192.3, 231, 455/303–305, 317, 323–324, 260, 234.1, 455/232.1, 240.1, 250.1, 296; 375/345, 340, 375/346
See application file for complete search history.

(56) References Cited

U.S. PATENT DOCUMENTS

| 6,484,042 | B1 | 11/2002 | Loke | |
|---|---|---|---|---|
| 6,504,884 | B1* | 1/2003 | Zvonar | 375/346 |
| 6,717,995 | B2* | 4/2004 | Zvonar | 375/340 |
| 6,882,208 | B1* | 4/2005 | Suissa et al. | 327/307 |
| 7,203,476 | B2* | 4/2007 | Ruelke et al. | 455/324 |
| 7,409,024 | B2* | 8/2008 | Ginesi et al. | 375/362 |
| 2004/0114697 | A1 | 6/2004 | Young | |

FOREIGN PATENT DOCUMENTS

| GB | 2346777 A | 8/2000 |
|---|---|---|
| GB | 2414609 A | 11/2005 |
| GB | 2415846 A | 1/2006 |

OTHER PUBLICATIONS

GB Search Report dated Jul. 7, 2006.
PCT International Search Report dated Oct. 27, 2008.
PCT International Preliminary Report on Patentability dated Dec. 11, 2008.

* cited by examiner

*Primary Examiner*—Edward Urban
*Assistant Examiner*—Christian A Hannon
(74) *Attorney, Agent, or Firm*—Randi L. Karpinia; Anthony P. Curtis (57) ABSTRACT

A wireless receiver (100) for receiving and demodulating a frequency modulated RF (radio frequency) signal by a direct conversion procedure, including channels (110, 112) for producing in-phase and quadrature components of a received RF signal, and a processor (123, 133) for periodically estimating an error in at least one of the in-phase and quadrature phase components and for producing a signal for adjustment of at least one of the in-phase and quadrature components to compensate for the detected error, wherein the processor is operable to apply alternatively each of a plurality of different procedures to estimate the error, the procedures including a first procedure which is applied when a signal quality value of the received RF signal is above a threshold value and a second procedure which is applied when a signal quality value of the RF received signal is not above the threshold value.

23 Claims, 8 Drawing Sheets

RECEIVER FOR USE IN WIRELESS COMMUNICATIONS AND METHOD OF OPERATION OF THE RECEIVER

FIELD OF THE INVENTION

This invention relates to a receiver for use in wireless communications and a method of operation of the receiver. In particular, the invention relates to a direct conversion receiver capable of demodulating a frequency modulated (FM) radio frequency (RF) signal by formation and use of in-phase (I) and quadrature phase (Q) components of the modulated signal.

BACKGROUND OF THE INVENTION

Conventional FM wireless receivers which utilize direct conversion architectures to detect I (in phase) and Q (quadrature phase) components of a received signal can experience non-optimal performance. Firstly, such receivers can develop errors in relative phase and amplitude between the I and Q components. The error in relative phase, herein referred to as 'phase error' and the error in relative amplitude, herein referred to as 'amplitude error', are sometimes referred to collectively as 'quadrature imbalance' errors. Furthermore, the receiver hardware can introduce into each of the I and Q components direct current (DC) offset errors. For example, such errors can be caused by radiation produced by local oscillators used in frequency downconversion and by imbalances in amplifiers of the receiver. All of these errors can contribute to distortion in a resulting output signal, e.g. an audio signal, produced by the receiver. The distortion may be unacceptable to users.

Procedures are known in the prior art for estimating the various errors in the I and Q components referred to earlier. It has been found that these procedures may be inaccurate under certain conditions. Furthermore, the known procedures may be dependent on modulation characteristics of the received FM signal or on a need to detect and correct for any frequency offset error between the carrier frequency of the received signal and the frequency of a local oscillator signal applied to obtain the signal. These dependencies can increase processing complexity in the receiver.

SUMMARY OF INVENTION

In accordance with a first aspect of the present invention there is provided a wireless receiver in accordance with claim 1 of the accompanying claims.

In accordance with a second aspect of the present invention there is provided a method of operation in accordance with the accompanying claims.

In embodiments of the invention to be described a new and improved procedure is employed to estimate at least one of the errors in the I component and the Q component as described earlier. The benefits which may be obtained by the new procedure are illustrated later.

Embodiments of the present invention will now be described by way of example with reference to the accompanying drawings, in which:

DESCRIPTION OF EMBODIMENTS OF THE INVENTION

Figure 1:
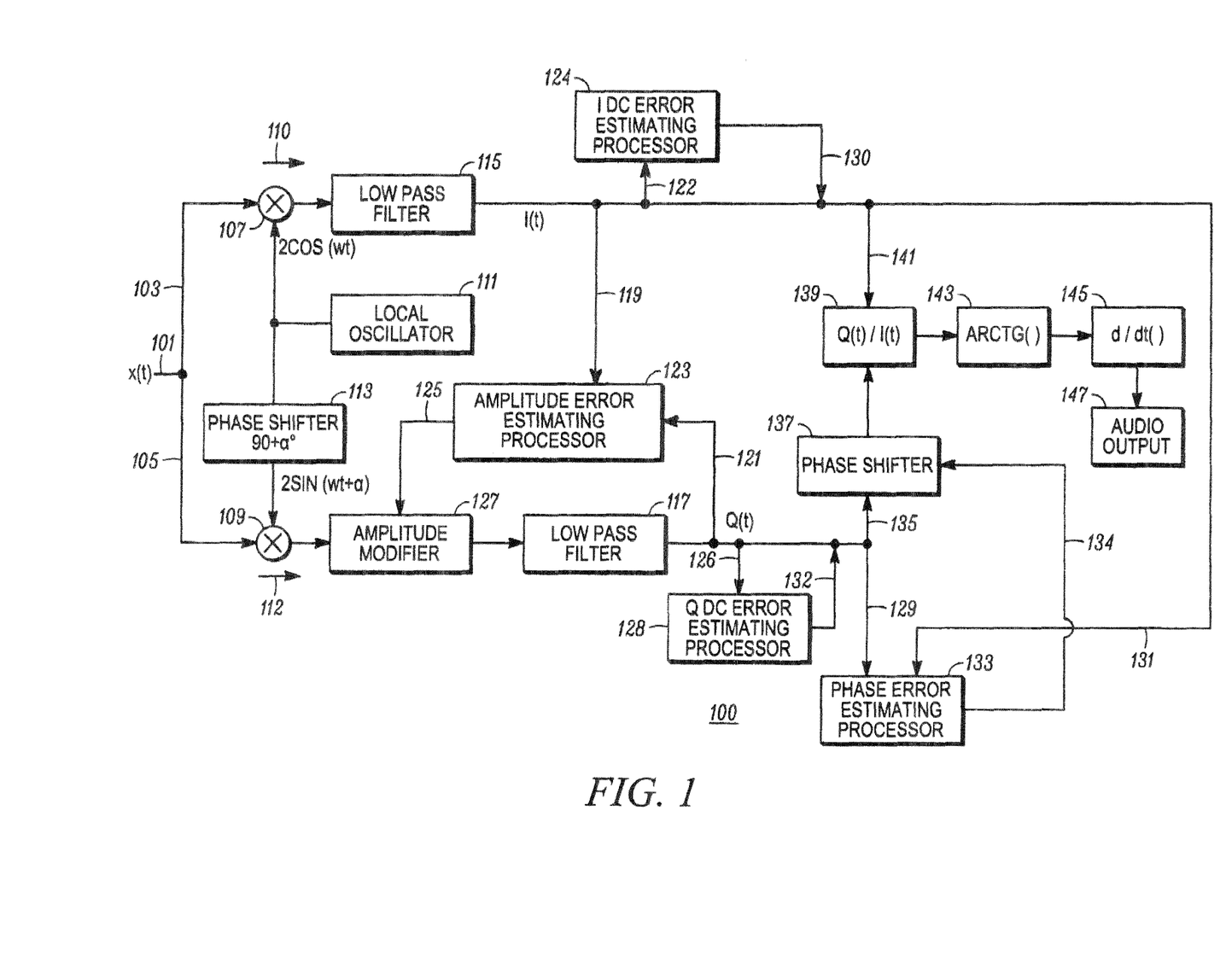
FIG. 1 is a block schematic diagram of a direct conversion RF receiver embodying the invention.

FIG. 1 shows an illustrative RF direct conversion receiver 100 embodying the present invention. An incoming received frequency modulated RF signal x(t) is delivered via an input path 101. Branched connections 103, 105 from the input path 101 lead respectively to two channels, namely an I channel 110 and a Q channel 112. An in phase or 'I' component of the received signal x(t) is generated and processed in the I channel 110. A quadrature phase or 'Q' component of the received signal x(t) is generated and processed in the Q channel 112. Mixers 107, 109 are included respectively in the I channel 110 and the Q channel 112. A local oscillator 111 generates a reference signal having the same frequency as the carrier frequency of the received RF signal x(t). A first component of the reference signal is applied directly to the mixer 107 where it is multiplied with the received RF signal x(t). A second component of the reference signal is applied to a phase shifter 113 which shifts a phase of the reference signal. A phase shifted output signal from the phase shifter 113 is applied to the mixer 109 where it is multiplied with the received RF signal x(t). The phase shifter 113 in combination with the mixers 107 and 109 is intended to introduce a phase shift of ninety (90) degrees with unity gain between the components of the reference signal applied respectively to the mixers 107 and 109. In practice, a phase shift slightly different from ninety degrees is produced, which is 90+α degrees, where α is an error, which may have a positive or negative value. The error α leads to the phase error referred to earlier. The phase error is a phase imbalance between signals provided as outputs by the mixers 107 and 109 in the I channel 110 and the Q channel 112 respectively.

Also, in practice a gain slightly different from unity is introduced for example by unequal gain of the mixers 107 and 109. The gain introduced, which may have a value above or below unity, produces the amplitude error referred to earlier. The amplitude error is an amplitude imbalance between signals provided as outputs by the mixers 107 and 109 in the I channel 110 and the Q channel 112 respectively.

Furthermore, the receiver 100 generates a residual DC offset which, for example, may be caused by operation of hardware components, particularly the local oscillator 111 and active components (not shown) associated with low pass filters 115, 117 referred to below. This offset produces the DC offset errors referred to earlier in the signals provided as outputs by the each of the mixers 107 and 109 in the I channel 110 and the Q channel 112 respectively. These errors are referred to herein respectively as an 'I DC error' and a 'Q DC error'.

An output signal from the mixer 107 is passed through a low pass filter 115 to produce a filtered output in-phase component I(t). An output signal from the mixer 109 is passed through a low pass filter 117 to produce a filtered output quadrature phase component Q(t).

The filtered output component I(t) passed by the low pass filter 115 is sampled by a connection 119, and the filtered output component Q(t) passed by the low pass filter (LPF) 117 is sampled by a connection 121. The respective sampled signals obtained by the connections 119 and 121 are provided as respective inputs to an amplitude error estimating processor 123. The processor 123 operates to estimate the amplitude error which has been introduced in relation to the components I(t) and Q(t). Operation of the processor 123 is to be described in more detail later. An output signal produced by the processor 123 is an amplitude error correction signal indicating a value of the reciprocal of an estimated gain introduced by the amplitude error. This correction signal is applied via a connection 125 to an amplitude modifier 127 which modifies the amplitude of the quadrature component Q(t) accordingly to eliminate the amplitude error.

The filtered output component I(t) passed by the low pass filter 115 is further sampled by a connection 122 forming an input to an I DC error estimating processor 124. The processor 124 operates to estimate the I DC error in the filtered component I(t) applied to it. The filtered output component Q(t) passed by the low pass filter 117 is sampled by a connection 126 forming an input to a Q DC estimating processor 128. The processor 128 operates to estimate the Q DC error in the filtered output component Q(t) applied to it. Each of the processors 124 and 128 generates as an output a correction signal which cancels the estimated DC error in the applied component. Thus, if the DC error estimated by one of the processors 124 and 128 is +E microvolts, the processor generates a DC correction signal which is −E microvolts. The DC correction signal from the processor 124 is added to the component I(t) via a connection 130. The DC correction signal from the processor 128 is added to the component Q(t) via a connection 132.

The filtered output component I(t) passed by the low pass filter 115 is further sampled by a connection 131, and the filtered output component Q(t) passed by the low pass filter 117 is further sampled by a connection 129. The sampled signals obtained by the connections 129 and 131 are provided as respective inputs to a phase error estimating processor 133. The processor 133 operates to estimate the phase error described earlier. An output signal from the processor 133 is a phase correction signal indicating a value of phase adjustment needed to be applied to the component Q(t) to cancel the estimated phase error. The phase correction signal produced by the processor 133 is applied to a phase shifter 137 via a connection 134. The phase shifter 137 is connected to the low pass filter 117 via a connection 135 included in the Q channel 112. The phase shifter 137 is thereby in a path of the filtered output component Q(t) after passing the connections 126, 132 and 129.

The filtered quadrature component Q(t) corrected for amplitude error and Q DC error is applied via the connection 135 to the phase shifter 137. The phase shifter 137 thereby applies a phase adjustment which cancels the phase error estimated by the processor 133. An output signal from the phase shifter 137 corresponding to a form of the quadrature component Q(t) corrected for phase error as well as amplitude error and Q DC error is applied to a processor 139. A signal corresponding to the filtered in-phase component I(t) produced as an output by the low pass filter 115 and corrected for I DC error is also applied as an input to the processor 139 via a connection 141 included in the I channel 110.

The processor 139 calculates a value of the quotient of the current value of the component Q(t) divided by the current value of the component I(t), Q(t)/I(t), from its respective inputs and supplies a signal representing the result of the calculation to a further processor 143. The processor 143 calculates a value of the arctangent (arctg) of the quotient represented by the input signal supplied from the processor 139. An output signal from the processor 143 is applied to a further processor 145 which calculates the differential with respect to time t, d/dt, of the input signal to the processor 145. Finally, an output signal representing the differential calculated by the processor 145 is applied from the processor 145 to an audio output 147. The audio output 147 includes a transducer such as an audio speaker which converts an output signal from the processor 145 in the form of an electronic signal into an audio signal, e.g. speech information. Operation of the processors 139, 143 and 145 and the audio output 147 is known per se.

In the receiver 100 of FIG. 1, the amplitude modifier 127 and the phase shifter 137 to which correction signals are applied to compensate for the amplitude error and the phase error respectively are in the Q channel 112 to apply suitable corrections to the quadrature component Q(t). It will be apparent to those skilled in the art that the amplitude modifier 127 and/or the phase shifter 137 could alternatively be in the I channel 110 to apply a correction to the in-phase component I(t). The applied correction(s) applied will of course be different in this case.

Figure 2:
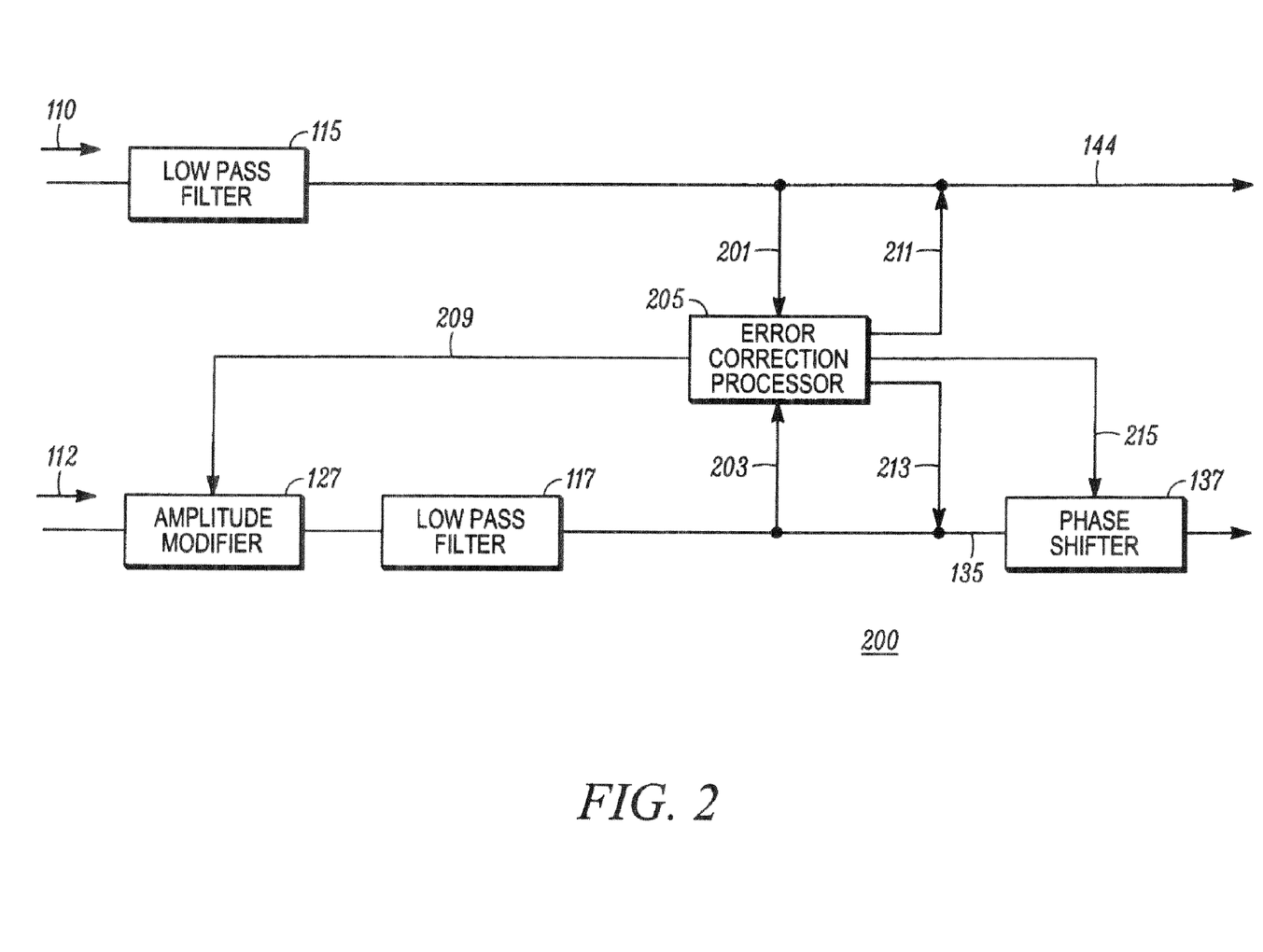
FIG. 2 is a block schematic diagram of parts of an alternative direct conversion RF receiver embodying the invention.

The I DC error estimating processor 124, the Q DC error estimating processor 128, the amplitude error estimating processor 123 and the phase error estimating processor 133 are shown in FIG. 1 as separate processors. However, the functions of two or more of these processors may be combined into a single processor. This is illustrated in a modified receiver 200 shown in FIG. 2, in which parts which are the same as parts in FIG. 1 have the same reference numerals. For simplicity, not all parts of the receiver 200 are shown in FIG. 2. In the receiver 200, the filtered I (in phase) component I(t) passed by the low pass filter 115 and the filtered Q (quadrature phase) component Q(t) passed by the low pass filter 117 are sampled respectively by a single pair of connections 201, 203. Each of the sampled I component I(t) and the sampled Q component Q(t), herein referred to as 'Components' or in the singular a 'Component', is delivered to a single error correction processor 205 which calculates separate values for each of the I DC error, the Q DC error, the phase error and the amplitude error referred to earlier. A connection 209 from the processor 205 delivers an output amplitude correction signal from the processor 205 to the amplitude modifier 127 to apply an amplitude adjustment signal which cancels the amplitude error estimated by the processor 205. A connection 211 from the processor 205 to the I channel 110 at the connection 141 delivers to the I channel 110 a DC correction signal which cancels the I DC error calculated by the processor 205. A connection 213 from the processor 205 to the Q channel 112 at the connection 135 delivers to the Q channel 112 a DC correction signal which cancels the Q DC error calculated by the processor 205. A connection 215 from the processor 205 delivers a phase correction signal to the phase shifter 137 to cause the phase shifter 137 to apply a phase adjustment which cancels the phase error estimated by the processor 205.

Figure 3:
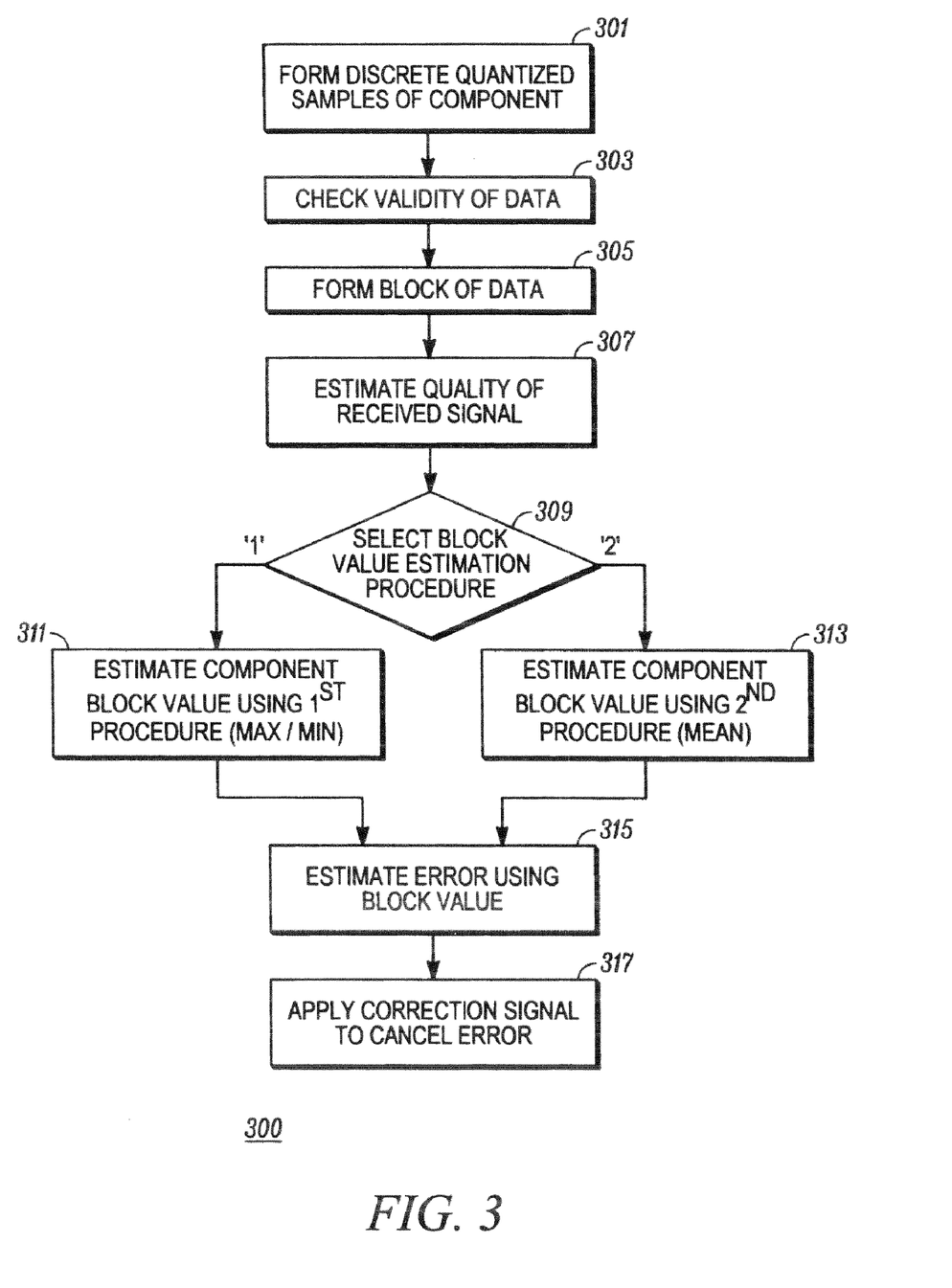
FIG. 3 is a flow chart of a method of operation in a processor of the receiver of FIG. 1 or FIG. 2.

Each of the processors 124, 128, 123, 133 of the receiver 100 of FIG. 1, and the processor 205 of the receiver 200 of FIG. 2, applies a method of operation embodying the invention including a new procedure for use in error estimation. FIG. 3 is a flow chart of a method 300 embodying the invention which illustrates use of the new procedure. Initially, it is assumed that either the I DC error or the Q DC error is to be estimated by the method 300. Adaptation of the method to estimate the phase error and the amplitude error is described later. In a step 301, the Component to be processed, either the I component or the Q component, is formed into discrete consecutive quantized samples in a known manner. The rate of forming the samples may be between ten thousand and thirty thousand discrete samples, e.g. twenty thousand samples, per second. In a step 303, a check of the validity of current data comprising the discrete quantized samples is made. The validity check determines whether the data is valid for use later in a step 309. The purpose of the validity check is to determine whether there has been a sudden change in signal amplitude which is related to signal quality value (e.g. Received Signal Strength Indication (RSSI) value) during this data buffer time. If there has been such a sudden change, the data is not valid because error estimations based on such data will give an incorrect result. A detailed example of a procedure for use in the validity check of step 303 is described later with reference to FIG. 5. In a step 305, completion of which follows an indication in step 303 that the data is valid, a block of the data is formed, e.g. by filling a buffer store with the data comprising the discrete samples in a known manner. The size of the block of data may be selected depending on the error to be estimated. For estimation of the I DC error or the Q DC error, the block may have $n_1$ discrete samples, where $n_1$ is a number between three hundred and seven hundred, e.g. 512 ($2^9$).

In a step 307, a signal quality of the received signal x(t) is measured in a known manner. The measured signal quality value may be the RSSI (received signal strength indication) and/or the S/N (signal to noise ratio) of the received signal x(t). In a step 309, a procedure for estimating a block value of the samples of the Component is selected dependent on the signal quality value measured in step 307. The block value is a representative value for each block of data formed in step 305. In a first procedure (herein referred to as 'MAX/MIN') which may be selected in step 309, maximum and minimum values of the discrete quantized samples for the data block are found. The block value is then found by adding the maximum and minimum values together and dividing by two. In a second procedure (herein referred to as 'MEAN') which may be selected in step 309, the values of all of the quantized samples in the data block are added together to produce a block sum value. The block sum value is then divided by the number of quantized samples in the data block to find a mean value which is used as the block value. The second procedure approximates to finding an integral with respect to time for the block then finding a mean of the integral. As illustrated later, it has been found that use of the first procedure gives a more accurate result for estimation of the block value when the quality of the received signal x(t) is good. The first procedure is not suitable when the quality of the received signal is poor because it is difficult to define signal maximum and minimum values in the presence of noise (with noise levels comparable to signal levels). The second procedure gives better results, and is thus used, when the signal quality is poor as illustrated later.

In particular, the first procedure gives a better result when the RSSI is above (better than) −95 dBm (ninety five decibels lower than 1 milliWatt in a fifty (50) Ohm radio frequency (RF) system). Alternatively, the first method gives a better result when the S/N value is greater than thirty five (35) decibels. Step 309 produces a '1' output to indicate selection in step 309 of the first procedure and alternatively produces a '2' output to indicate selection in step 309 of the second procedure.

If step 309 produces a '1' output, a step 311 follows in which a block value of the Component is estimated using the first procedure described above. If step 309 produces a '2' output, a step 313 follows in which a block value of the Component is estimated using the second procedure described above. In a step 315 an error is estimated using the block value estimated by either step 311 or step 313. The error is one of the I DC error and the Q DC error referred to earlier and is estimated in step 315 in a known way. Examples of calculation procedures to carry out the different error estimations are given later.

Finally, in a step 317, a correction signal is applied to cancel the estimated I DC error or Q DC error as described earlier.

Where the phase error or the amplitude error is to be estimated, a modified form of the method 300 may be used in which data formed into a data block in step 305 is further processed to form a further data block before step 311 or step 313 is applied. Thus, steps 311 and 313 are applied to data blocks derived by further processing from the blocks of samples of the I or Q components. Illustrative examples of the further processing are described later. Where the error to be estimated is the phase error, the initial data block formed in step 305 may have $n_2$ discrete samples, where $n_2$ is a number between one thousand and three thousand, e.g. 2048 ($2^{11}$). Where the error to be estimated is the amplitude error, the initial data block formed in step 305 may have $n_3$ discrete samples, where $n_3$ is a number between three thousand and five thousand, e.g. 4096 ($2^{12}$). Steps 307 to 315 are again applied for phase and amplitude error estimation. The error estimation in step 317 used to estimate the phase error may be carried out in a known way, e.g. as described later, different from that used for I DC or Q DC error estimation. The error estimation in step 317 used to estimate the amplitude error may be carried out in a known way, e.g. as described later, different from that used for I DC or Q DC error and for phase error estimation.

Figure 4:
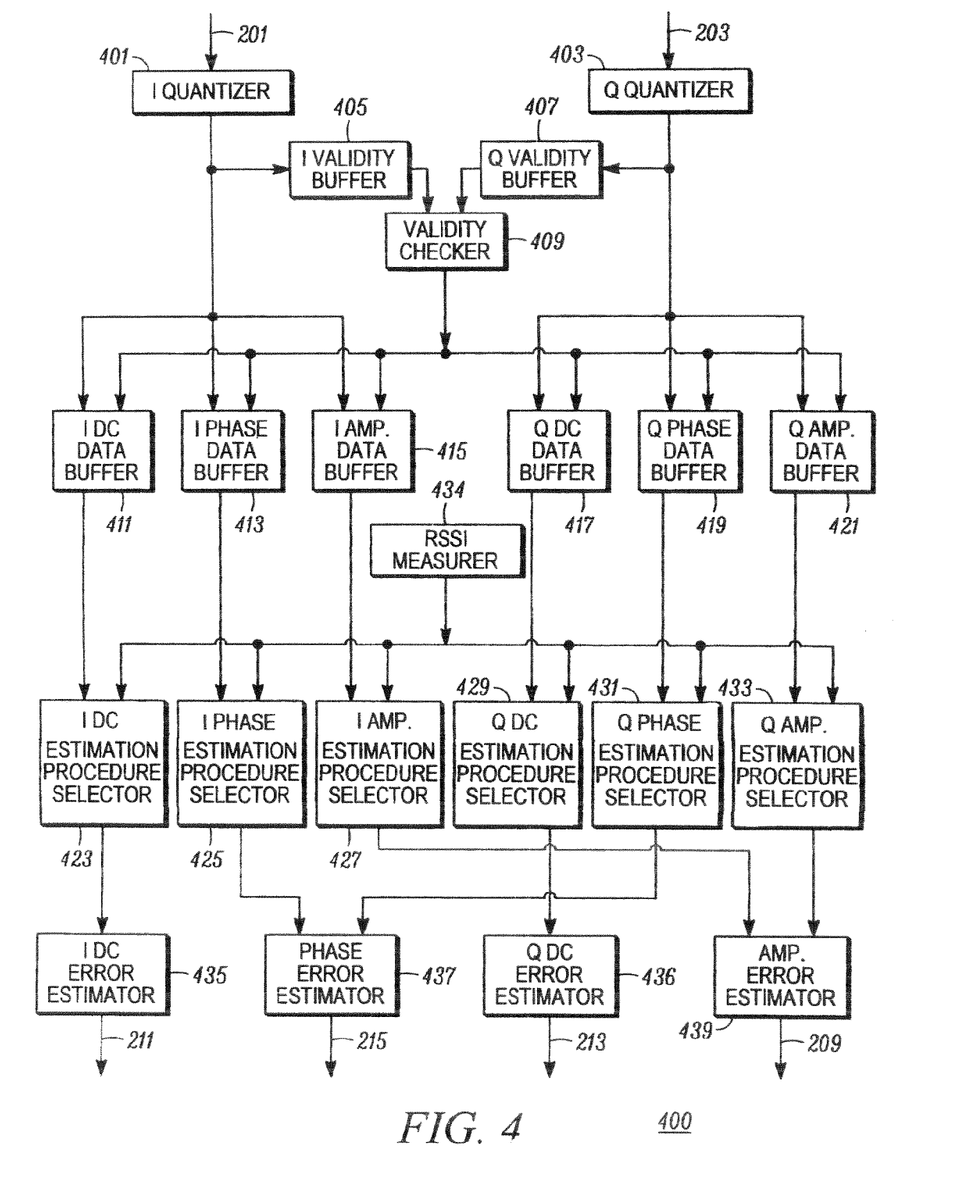
FIG. 4 is a block schematic diagram of an illustrative example of a processor employing the method of FIG. 3 in the processor.

FIG. 4 shows functional units of a processor 400 which is an example of the processor 205 of FIG. 2 illustrating an application of the method 300 to estimate at the same time each of the I DC error, the Q DC error, the phase error and the amplitude error. In FIG. 4, the I component I(t) and the Q component Q(t) of an input received signal x(t) are separately sampled by the connections 201 and 203 as described earlier with reference to FIG. 2. The I component I(t) is initially divided in a known manner into discrete, consecutive, quantized samples by an I quantizer 401 operating in a known manner. These samples are referred to herein as 'I data'. Likewise, the Q component Q(t) is initially divided into discrete, consecutive, quantized samples by a Q quantizer 403. These samples are referred to herein as 'Q data'. For example, the size of each quantized sample taken to form each of the I data and the Q data may be about 50 (fifty) microseconds using a rate of taking quantized samples of about 20 (twenty) kilosamples per second.

The I quantizer 401 is connected in parallel to, and provides I data to, each of an I validity buffer 405, an I DC data buffer 411, an I phase data buffer 413 and an I amplitude (amp.) data buffer 415. Likewise, the Q quantizer 403 is connected in parallel to, and provides Q data to, a Q validity buffer 407, a Q DC data buffer 417, a Q phase data buffer 419 and a Q amplitude (amp.) data buffer 421.

Each of the buffers 405, 407, 411, 413, 415, 417, 419 and 421 comprises a temporary store for data added to it. Each of these buffers has a maximum capacity of I data or Q data that it can hold. The maximum capacity of each of the I validity buffer 405 and the Q validity buffer 407 may for example be 256 (two hundred and fifty six) quantized samples. The maximum capacity of the I DC data buffer 411 and the Q DC data buffer 417 may for example be 512 (five hundred and twelve) quantized samples. The maximum capacity of the I phase data buffer 413 and the Q phase data buffer 419 may for example be 2048 (two thousand and forty eight) quantized samples. The maximum capacity of the I amplitude data buffer 415 and of the Q amplitude data buffer 421 may for example be 4096 (four thousand and ninety six) quantized samples.

When each of the buffers 405, 407, 411, 413, 415, 417, 419 and 421 is full, the data in it is provided as a data output in the form of a block of samples of I or Q data, the block size being equal to the maximum number of quantized samples stored in the buffer which has produced the block. Each buffer then receives further input data until it is full again, and so on.

Blocks of I data from the I validity buffer 405 and of Q data from the Q validity buffer 407 are delivered to a validity checker 409. The validity checker 409 operates to determine if the I and Q data it receives is valid in that no sudden change in amplitude (signal quality) has occurred. Operation of the validity checker 409 is described in more detail later with reference to FIG. 5.

If the validity checker 409 determines that the block of data it checks is valid, it allows a block of checked I data from the I quantizer 301 to be added to the buffers 411, 413, 415 and a block of checked Q data from the Q quantizer 403 to be added to the buffers 417, 419 and 421. Thus, the addition of data to the buffers 411, 413, 415, 417, 419 and 421 is conditional on the validity checker 409 allowing the addition for each given checked block of data. If the validity checker 409 determines that the block of data it checks is not valid, it stops addition of the corresponding block of I data from the I quantizer 301 to the buffers 411, 413, 415 and the corresponding block of Q data from the Q quantizer 403 to the buffers 417, 419 and 421. Data addition to each of the buffers 411, 413, 415, 417, 419 and 421 when allowed by the validity checker 409 continues until each buffer is full. Each buffer then provides the data as a data block output and begins to re-fill, and so on.

The I DC data buffer 411 is connected to an I DC estimation procedure selector 423 to which it supplies a block of I data when the I DC data buffer 411 is full. The I phase data buffer 413 is connected to an I phase estimation procedure selector 425 to which it supplies a block of I data when the I phase data buffer 413 is full. The I amplitude data buffer 415 is connected to an I amplitude estimation procedure selector 427 to which it supplies a block of I data when the I amplitude data buffer 415 is full. The Q DC data buffer 417 is connected to a Q DC estimation procedure selector 429 to which its supplies a block of Q data when the Q DC data buffer 417 is full. The Q phase data buffer 419 is connected to a Q phase estimation procedure selector 431 to which its supplies a block of Q data when the Q phase data buffer 419 is full. The Q amplitude data buffer 421 is connected to a Q amplitude estimation procedure selector 433 to which its supplies a block of Q data when the Q amplitude data buffer 421 is full.

Each of the selectors 423, 425, 427, 429, 431 and 433 selects for each data block provided to it a procedure to be used for estimation of a data block value for the block of data. Each of the selectors 423, 425, 427, 429, 431 and 433 is connected to an RSSI measurer 434 (which may be outside the processor 205). The RSSI measurer 434 measures in a known way a value, which is current for the block of data received by each of the selectors 423, 425, 427, 429, 431 and 433, of the RSSI (received signal strength indication) of the input received signal x(t). The current measured RSSI value is provided from the RSSI measurer 434 to each of the selectors 423, 425, 427, 429, 431 and 433. Each of the selectors 423, 425, 427, 429, 431 and 433 selects either the first procedure ('MIN/MAX') or the second procedure ('MEAN') defined earlier, depending on the current measured RSSI value. Thus, each of the selectors 423, 425, 427, 429, 431 and 433 selects the first procedure for carrying out a block value estimation when the measured RSSI value is above (better than) a pre-determined threshold, and selects the second procedure for carrying out a block value estimation when the measured RSSI value is not greater than the pre-determined threshold. Preferably, the threshold RSSI value is −95 dBm (ninety five decibels lower than 1 milliwatt in a 50 Ohm RF system,).

In general, a different threshold may be employed in each of the selectors 423, 425, 427, 429, 431 and 433 to determine whether to use the first or second procedure. However, a common threshold value may conveniently be employed.

The I DC estimation procedure selector 423 is connected to an I DC error estimator 435 and delivers each block of I DC data to the estimator 435 together with an indication of the procedure it has selected for estimating the corresponding data block value. The Q DC estimation procedure selector 429 is connected to a Q DC error estimator 436 and delivers each block of Q DC data to the estimator 436 together with an indication of the procedure it has selected for estimating the corresponding data block value. Each of the I DC error estimator 435 and the Q DC error estimator 436 estimates a value of the data block value using the selected procedure and then proceeds to use the data block value to estimate the DC offset error in a known manner. The I DC estimator 435 provides an output which is an I DC correction signal to the connection 211 (FIG. 2), and the Q DC estimator 436 provides an output which is a Q DC error correction signal to the connection 213 (FIG. 2).

For example, the I DC offset error may be estimated in the I DC estimator 435 using the procedure as described in UK patent application number GB 0505493.7 entitled 'Receiver for receipt and demodulation of a frequency modulated RF signal and a method of operation', filed Mar. 18, 2006, equivalent to international application number PCT/US06/06821 filed Feb. 26, 2006, (the entire contents of which are incorporated herein by reference). The procedure uses a calculation based on the relationship:

$$HW(I)\text{dc\_est} = \frac{1}{T}\int_0^T I(t)dt \qquad \text{[Equation 1]}$$

where HW(I)dc_est is the I DC offset error to be estimated. Similarly, the Q DC offset error may be estimated in the I DC estimator 436 as described in UK patent application number GB 0505493.7 using a calculation based on the relationship:

$$HW(Q)\text{dc\_est} = \frac{1}{T}\int_0^T Q(t)dt \qquad \text{[Equation 2]}$$

where HW(Q)dc_est is the Q DC offset error to be estimated. Use of the first procedure and the second procedure in relation to Equation 1 and Equation 2 is further analysed later.

The I phase estimation procedure selector 425 and the Q phase estimation procedure selector 431 in FIG. 4 are connected to a phase error estimator 437 and each of the selectors 425 and 431 delivers each block of data together with an indication of the procedure which it has selected to estimate a data block value. The estimator 437 uses the data blocks it receives to estimate a value of phase error. In consequence, the phase error estimator 437 produces an output phase error correction signal which is delivered via the connection 215 to the phase shifter 137 (FIG. 2) to correct for the estimated phase error.

For example, the phase error may be estimated by the estimator 437 as described in published UK patent specification number GB-A-2414609 (the entire contents of which are herein incorporated by reference) using a calculation based on the relationships:

$$L = \frac{1}{T}\int_0^T I(t)Q(t)dt = \frac{A^2}{T}\int_0^T \cos\left(\varphi + \frac{\varepsilon}{2}\right)\sin\left(\varphi - \frac{\varepsilon}{2}\right)dt \quad \text{[Equation 3]}$$

$$= \frac{A^2}{T}\int_0^T \sin(2\varphi)dt - \frac{A^2}{2}\sin(\varepsilon) = \sim -\frac{A^2}{2}\sin(\varepsilon) \quad \text{[Equation 4]}$$

where L is vector inner product, $\varepsilon$ is phase error to be determined, $\Phi$ is a frequency modulated signal which may be known for the purpose of the phase error calculation, t is time, T is the integration time employed (the length of the phase data block referred to earlier), and A is signal amplitude. The value of $\varepsilon$ can be found separately by looking for a minimum of the absolute value of $L(\varepsilon)$.

If the phase error is calculated as described in GB-A-2414609, the estimator 215 forms a multiplication product for each quantised value of I(t) in an I phase data block and each quantised value of Q(t) in a Q phase data block and thereby forms a data block of multiplication product values. The selected procedure for estimating a data block value is then applied to the data block of multiplication product values. The vector inner product L may be obtained from the data block value.

The I amplitude procedure selector 427 and the Q amplitude procedure selector 433 are connected to an amplitude error estimator 439. Each of the selectors 427 and 433 delivers each block of data together with an indication of the procedure which it has selected to estimate a data block value. The estimator 439 estimates a value of amplitude error in a known manner. In consequence, the amplitude error estimator 439 produces an output amplitude error correction signal which is delivered via the connection 209 to the amplitude modifier 127 (FIG. 2) to correct for the estimated amplitude error.

For example, the amplitude error may be estimated as described in published UK patent specification number GB-A-2415846 (the entire contents of which are incorporated herein by reference) using a calculation based on the relationship:

$$A = \sqrt{\frac{\int_0^T I^2}{\int_0^T Q^2}} = \frac{(1+a)\int_0^T (1 - \cos(2\varphi))dt}{\int_0^T (1 + \cos(2\varphi))dt} = \sim 1+a \quad \text{[Equation 5]}$$

where $\alpha$ is the amplitude error and the other symbols are as defined above.

If the amplitude error is calculated as described in GB-A-2415846 using Equation 5 above, the estimator 439 forms a value of the square for each quantized value of I(t) in an I phase data block and a square for each quantised value of Q(t) in a Q phase data block, and thereby forms data blocks of each of the individual square values. The selected procedure for estimating a data block value for the I data is then applied to the data block of I(t) square values. The selected procedure for estimating a data block value for the Q data is applied to the data block of Q(t) square values. Subsequently, using Equation 5, the estimator 439 finds a value of the quotient of the block value for the data block of I(t) square values and of the block value for the data block of Q(t) square values and finds the square root of the quotient from which 1+$\alpha$, then $\alpha$ is easily obtained.

Figure 5:
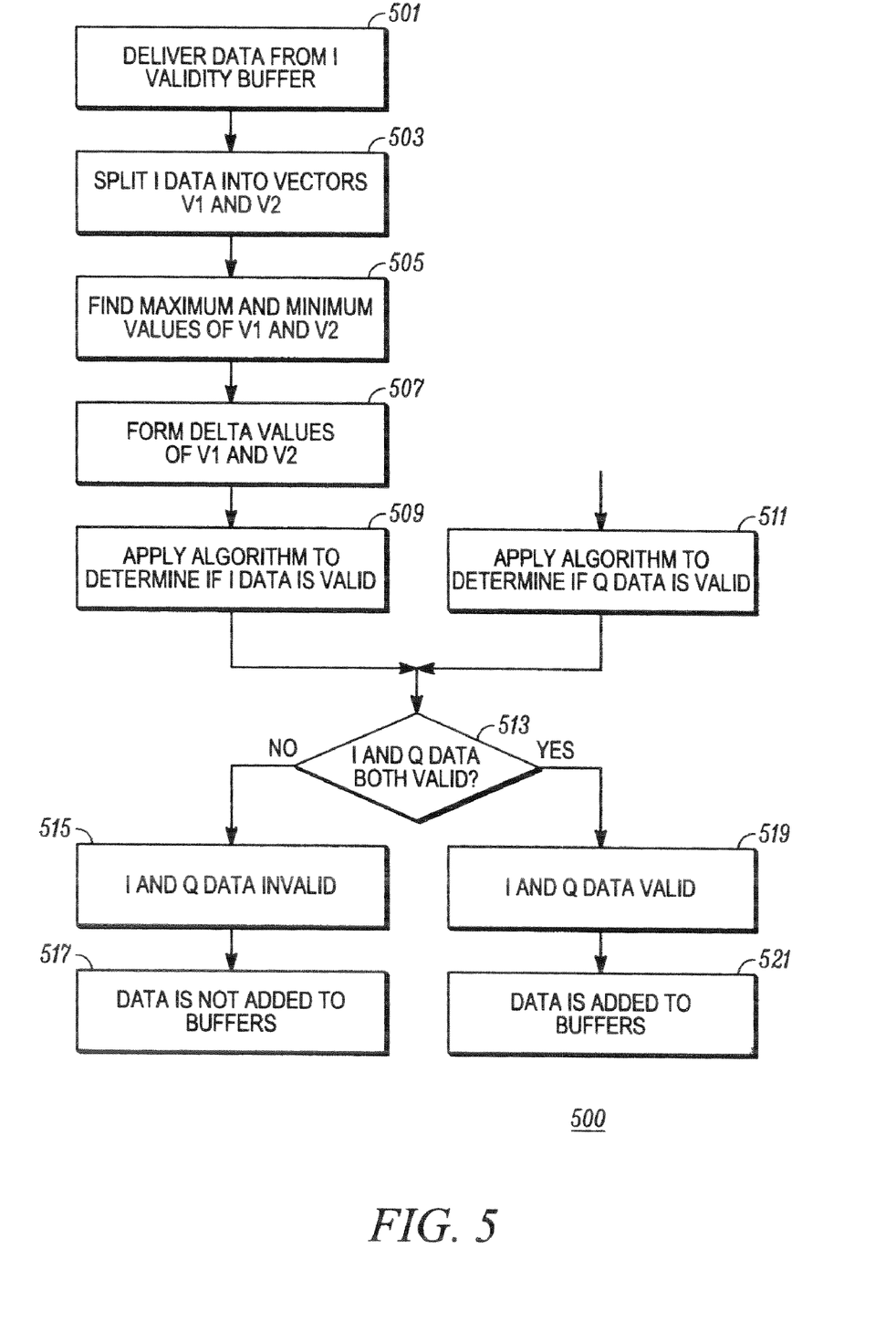
FIG. 5 is a flow chart of an illustrative method employed in a data validity checker in the processor of FIG. 4.

FIG. 5 is a flow chart of a method 500 of operation of the validity checker 409 shown in FIG. 4. In a step 501, a block of I data is delivered from the I validity buffer 405. In a step 503, the data is split into two vectors (portions) V1 and V2. The vectors V1 and V2 are the quantized samples respectively in the first half and the second half of the data block. In a step 505, maximum values V$1_{max}$ and V$2_{max}$, and minimum values V$1_{min}$ and V$2_{min}$ of the vectors V1 and V2 are found. In a step 507, Delta values of the vectors V1 and V2 are calculated. The Delta value of V1, Delta 1, is the difference between the maximum value of V1, V$1_{max}$, and the minimum value of V1, V$1_{min}$. The Delta value of V2, Delta 2, is the difference between the maximum value of V2, V$2_{max}$, and the minimum value of V2, V$2_{min}$. In a step 509, an algorithm is applied to determine whether the I data is valid. This is done by applying two Conditions 1 and 2 and determining if both Conditions 1 and 2 are met. Conditions 1 and 2 are defined as follows:

Condition 1: the value of Delta 1 is between the value of T2·Delta 2 and the value of T1·Delta 2 where T2 and T1 are predetermined multipliers and · represents a multiplication operation; and Condition 2: the value of V$1_{max}$ is between the value of T2·V$2_{max}$ and the value of T1·V$2_{max}$ where T1 and T2 and · are as in Condition 1.

Suitable values of T1 and T2 for use in applying Conditions 1 and 2 may be found by investigation depending on the other conditions used in the method 500. Typical values are respectively 0.96 and 1.04, for a quantized sample length of 50 (fifty) microseconds and a validity data block of 256 (two hundred and fifty six) quantized samples).

A signal produced by step 509 indicating whether or not Conditions 1 and 2 are both met provides an input to a step 513. In a step 511, an algorithm similar to that applied in step 509 is applied to Q data to determine if the Q data is valid. Step 511 is preceded by steps (not shown) similar to steps 501 to 507. A signal produced by step 511 indicating whether or not the algorithm applied in step 511 has found the Q data to be valid also provides an input to step 513.

Step 513 determines if both of the I data and the Q data in corresponding blocks is valid as indicated by the outputs of steps 509 and 511. Step 513 produces a 'NO' output in a step 515 indicating that the I and Q data is invalid if one or both of the I data and the Q data is found in step 513 not to be valid. Step 513 produces a 'YES' output in a step 519 indicating that the I and Q data is valid if both of the I data and the Q data is found in step 513 to be valid.

If a 'NO' output is produced by step 513, indicating the I and Q data to be invalid in step 515, a step 517 follows in which an indication is produced that the invalid block of data which has been investigated is not to be added to the buffers 411 to 421. If a 'YES' output is produced by step 513, indicating in step 519 that the I and Q data is valid, the validity checker 409 issues a signal indicating that the valid block of data which has been investigated can be added to the buffers 411 to 421.

The benefit of using the first procedure in step 311 of the method 300 embodying the invention when the received signal quality is greater than a pre-determined threshold can be demonstrated by practical experimentation and/or by mathematical analysis, by plotting an estimate of an error (or deviation of estimated error from a known error) as a function of RSSI, using separately each of the first and second procedures.

Figure 6:
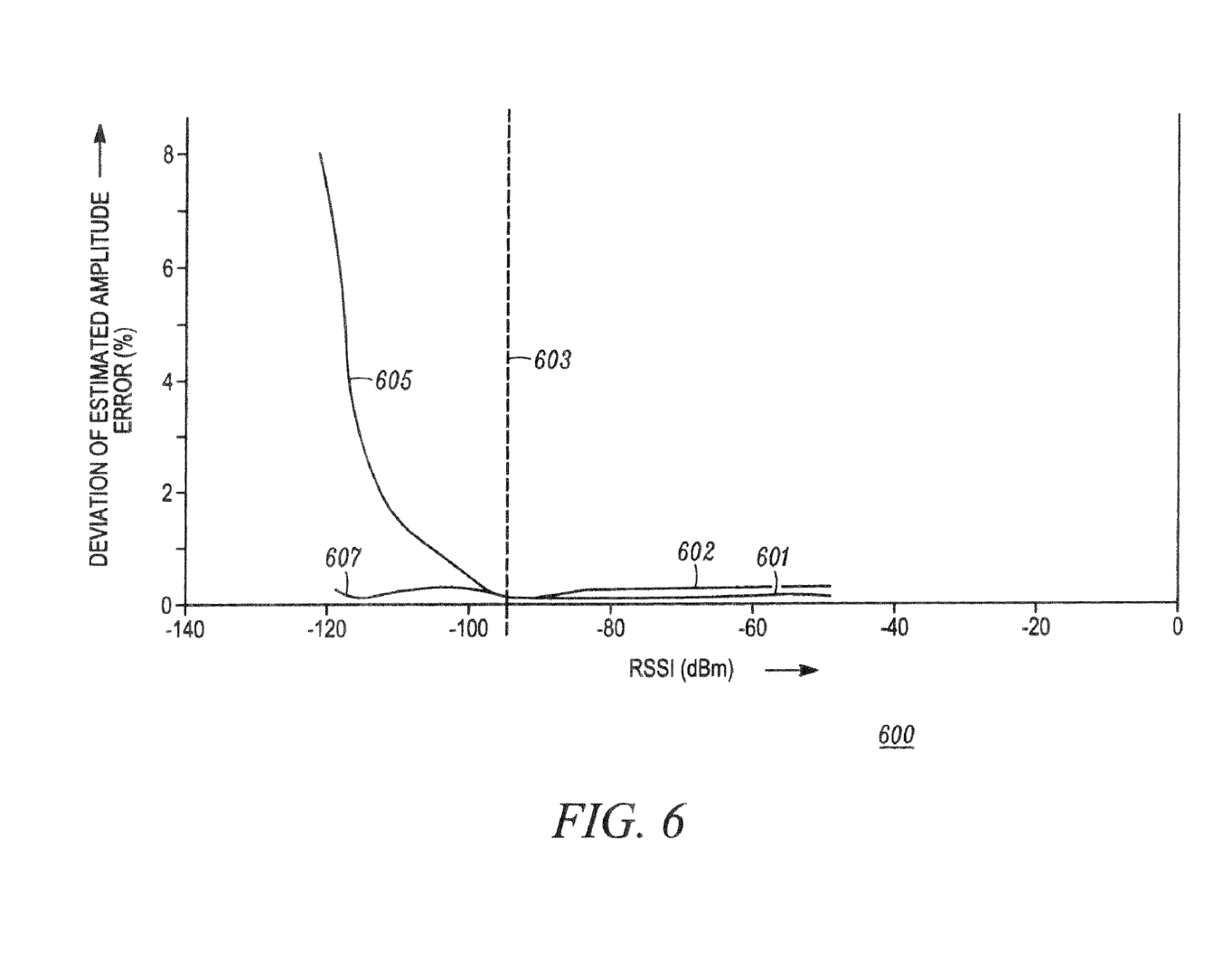
FIG. 6 is a graph of phase error versus RSSI (received signal strength indication) illustrating the benefit of using a first error estimation procedure rather than a second error estimation procedure when applied to phase error estimation in the method of FIG. 3.

In order to demonstrate the benefit of using the first procedure in amplitude error estimation, a practical experiment was carried out as follows. Detection of a known frequency modulated signal, namely a 67 Hz (sixty seven Hertz) Digital Private Line sub audio signalling with a 750 Hz frequency deviation (herein referred to as 'DPL/PL'), was investigated in a receiver having known properties. Amplitude error of the received signal in the receiver employed was known to be 2% (two percent). Using a data analysis time of eight (8) seconds, 160,000 discrete data samples were divided into blocks having a length of 4096 samples. Amplitude error as a function of measured RSSI of the received signal was estimated. The first and second procedures described above were separately used to obtain block values for use in the amplitude error estimation. FIG. 6 shows the results obtained. FIG. 6 is a graph 600 of deviation of estimated amplitude error from the known amplitude error measured in per cent (based on the amplitude) plotted against RSSI measured in dBm (decibels lower than 1 milliwatt in a 50 ohm RF system). Ideally, the deviation should be zero. A threshold of −95 dBm, indicated by a dashed vertical line 603, distinguishes between low (poor) and high (good) RSSI values. A curve 605 indicates the amplitude error deviation at low RSSI values using the first procedure ('MIN/MAX') referred to earlier, and a curve 607 indicates the amplitude error deviation at low RSSI values using the second procedure ('MEAN') referred to earlier. The deviation indicated by the curve 607 remains close to zero, whereas the deviation indicated by the curve 605 undesirably rises rapidly for RSSI values below the threshold 603. Thus for RSSI values lower than (poorer than) the RSSI threshold 603 the second procedure ('MEAN') gives better performance and is selected for use in block value estimation. A curve 601 indicates the amplitude error deviation at high RSSI values using the first procedure ('MIN/MAX') referred to earlier, and a curve 602 indicates the amplitude error deviation at high RSSI values using the second procedure ('MEAN') referred to earlier. The deviation indicated by the curve 601 is closer to zero than the deviation indicated by the curve 602. Thus for RSSI values higher than (better than) the RSSI threshold 603, the first procedure ('MIN/MAX') gives better performance and is selected for use in block value estimation.

Figure 7:
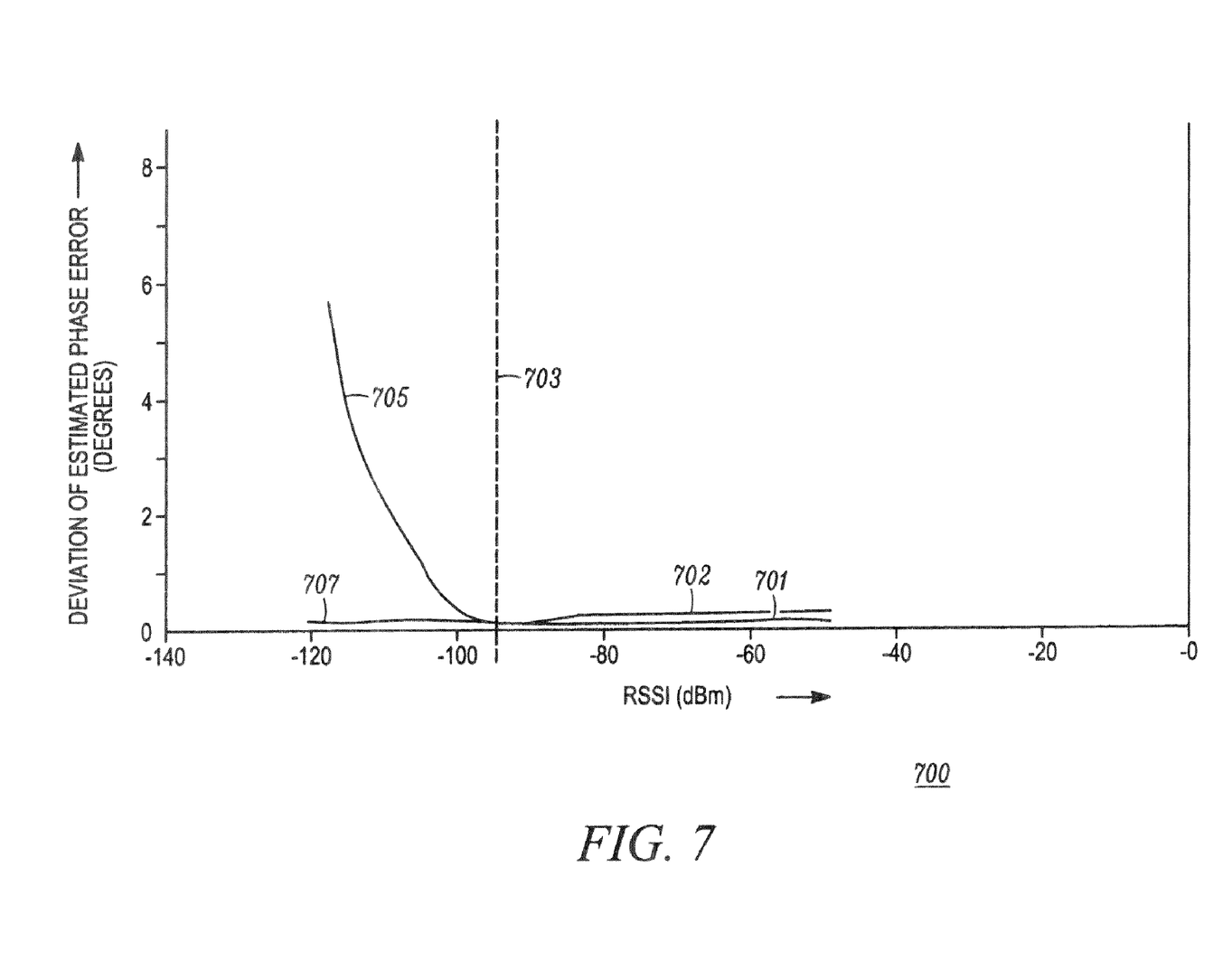
FIG. 7 is a graph of amplitude error versus RSSI further illustrating the benefit of using a first error estimation procedure rather than a second error estimation procedure when applied to amplitude error estimation in the method of FIG. 3.

In order to demonstrate the benefit of using the first procedure in phase error estimation, the same known frequency modulated signal was detected by the same receiver as described above for the amplitude error investigation. Phase error of the received signal in the receiver employed was known to be four (4) degrees. A data analysis time of eight (8) seconds was again used to provide 160,000 discrete data samples which were divided into blocks having a length of 2048 samples. Phase error as a function of measured RSSI of the received signal was separately estimated using the first and second procedures described above to obtain block values for use in the phase error estimation. FIG. 7 shows the results obtained. FIG. 7 is a graph 700 of deviation of the estimated phase error from the known phase error measured in degrees plotted against measured RSSI measured in dBm (decibels lower than 1 milliwatt in a 50 ohm RF system). Ideally, the deviation should be zero. The results obtained are similar to those obtained for amplitude error estimation plotted in the graph 600 of FIG. 6. A threshold of −95 dBm, indicated by a dashed vertical line 703, distinguishes between low (poor) and high (good) RSSI values. A curve 705 indicates the phase error deviation at low RSSI values using the first procedure ('MIN/MAX') referred to earlier, and a curve 707 indicates the phase error deviation at low RSSI values using the second procedure ('MEAN') referred to earlier. The deviation indicated by the curve 707 remains close to zero, whereas the deviation indicated by the curve 705 undesirably rises rapidly for RSSI values below the threshold 703. Thus for RSSI values lower than (poorer than) the RSSI threshold 703 the second procedure ('MEAN') gives better performance and is selected for use in block value estimation for use in phase error determination. A curve 701 indicates the phase error deviation at high RSSI values using the first procedure ('MIN/MAX') referred to earlier, and a curve 702 indicates the phase error deviation at high RSSI values using the second procedure ('MEAN') referred to earlier. The deviation indicated by the curve 701 is closer to zero than the deviation indicated by the curve 702. Thus for RSSI values higher than (better than) the RSSI threshold 603, the first procedure ('MIN/MAX') gives better performance and is selected for use in block value estimation for use in phase error determination.

When the first and second procedures are compared for use in providing block values to estimate DC error, the second ('MEAN') procedure is again shown to be better than the first ('MIN/MAX') procedure for use at low (poor) RSSI values. However, the second ('MEAN') procedure can produce large estimation errors for high (good) RSSI values. This can be analysed in detail as follows.

Equation 1 given earlier may be rewritten as follows:

$$HW(I)\text{dc\_est} = \frac{1}{T}\int_0^T I(t)dt \quad \text{[Equation 6]}$$

$$= \frac{1}{T}\int_0^T (HW(I)dc + A\cos(2\pi f_d \sin(\omega_m t)))dt$$

$$= HW(I)dc +$$

$$\frac{A}{T}\int_0^T \left( J_o(2\pi f_d) + 2\sum_{k=1}^{\infty} J_k(2\pi f_d)\cos(2k\omega_m t) \right) dt$$

$$= HW(I)dc + AJ_o(2\pi f_d)$$

where:

J represents a Bessel function;

k represents an order of a Bessel function $J_0$ represents a zero order Bessel function (equal to a constant);

HW(I)dc is the true I DC offset error due to receiver hardware;

A is the amplitude of a received signal; A has a known proportionality to RSSI value;

$f_d$ is a deviation frequency measured in Hertz employed in a known frequency modulated signal;

$\omega_m$ is an angular frequency of the known modulated signal (e.g. the known 'PL/DPL' audio signalling tone) measured in radians per second; and T is integration time.

Typical values for parameters given above can be applied as follows:

$HW(I)dc = 3 \times 10^{-3}$ volts;

$f_d = 750$ Hertz;

$J_o(2\pi f_d) = 8.2 \times 10^{-3}$.

Using these typical values, HW(I)dc_est (in volts) for an RSSI value of −60 dBm can be calculated using Equation 3 as $HW(I)dc+9.8 \times 10^{-3}$. Also using these typical values, HW(I) dc_est (in volts) for an RSSI value of −110 dBm can be calculated using Equation 6 as $HW(I)dc+32 \times 10^{-6}$. From these calculations it can be seen that HW(I)dc_est is essentially the same as HW(I)dc for an RSSI value of −110 dBm, whereas HW(I)dc_est for an RSSI value of −60 dBm differs significantly from the true value HW(I)dc. This difference for an RSSI value of −60 dBm arises from the use of the approximate integration function in the second procedure defined earlier ('MEAN') to estimate HW(I)dc_est. However, if the first procedure defined earlier ('MIN/MAX') is used instead to estimate HW(I)dc_est, the result obtained is essentially the same as HW(I)dc. Similar results are obtained when estimating HW(Q)dc_est. A graphical illustration of the divergence of HWdc_est and HWdc for high RSSI values is given in FIG. 8.

Figure 8:
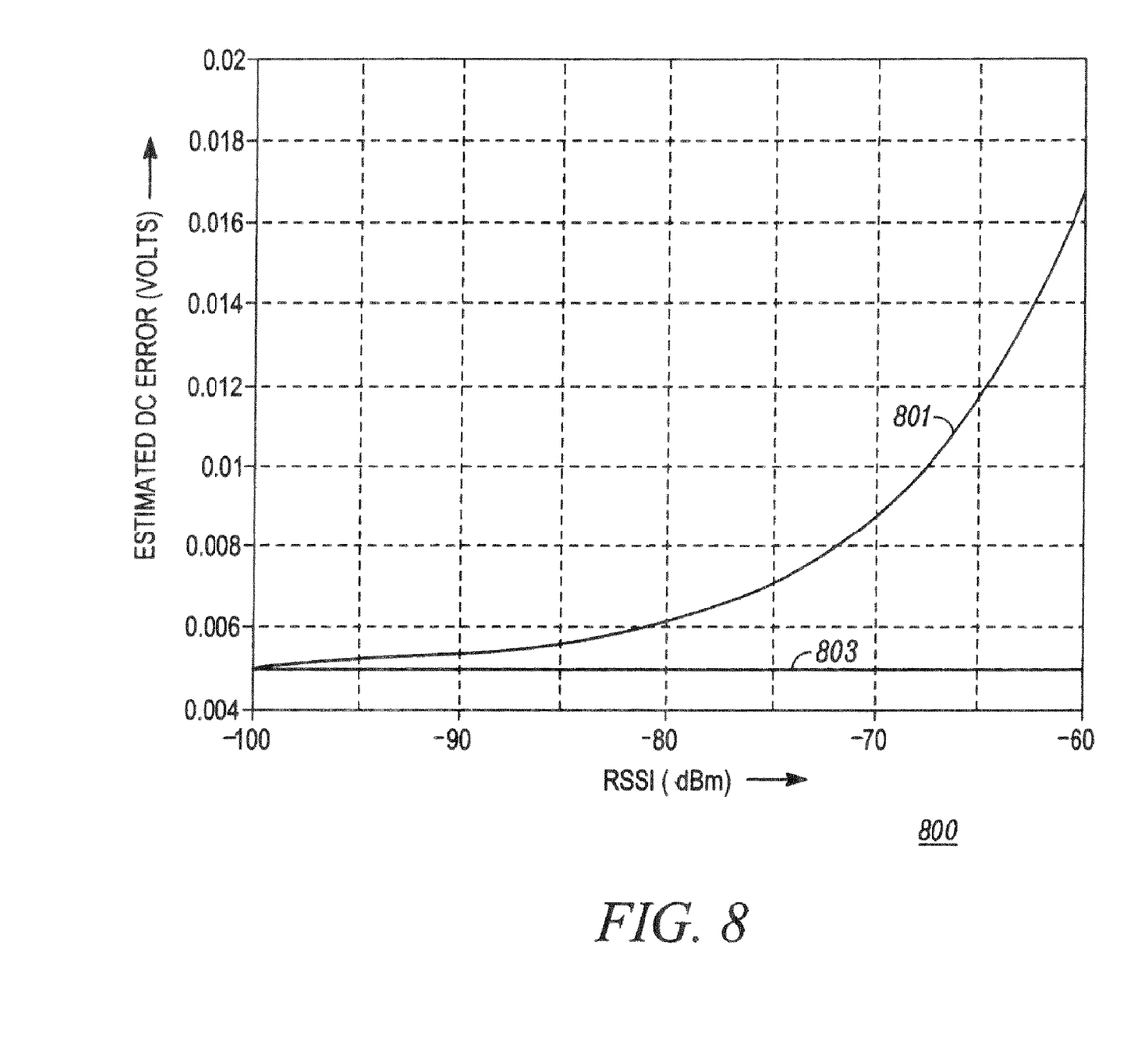
FIG. 8 is a graph of DC error versus RSSI further illustrating the benefit of using a first error estimation procedure rather than a second error estimation procedure for high (good) RSSI signal to noise ratio) when applied to DC offset error estimation in the method of FIG. 3.

FIG. 8 is a graph 800 of estimated DC error plotted against RSSI in dBm (decibels lower than 1 milliWatt in a 50 ohm RF system), for high values of RSSI, when a known DC offset error of 0.005 volts is present. The graph 800 is plotted using results obtained by mathematical analysis by application of the DC error calculation procedure described in patent application GB 0505493.7 and summarised in Equation 6 above. A curve 801 in FIG. 8 indicates the results obtained when block value is obtained using the second procedure ('MEAN') described above. A line 803 indicates the applied DC error of 0.005 volts (this could be either an error in the component I(t) or in the component Q(t). The results obtained using the mean procedure described above ('MIN/MAX') provide a plot which substantially coincides with the line 803. This can be explained with reference to Equation 6 given earlier as follows. If the first procedure ('MIN/MAX') is used to carry out the integration to obtain the block value the result obtained is only HW(I)dc since the other terms on the second line of Equation 6 cancel each other. However, if the second procedure ('MEAN') is employed the result obtained is HW(I)dc+ $AJ_o(2\pi f_d)$ as in third line of Equation 6. Thus, for high (good) RSSI values above −95 dBm, the estimated DC error deviates rapidly from 0.005 volts as indicated by the curve 801 for the second procedure ('MEAN'), but remains substantially on the line 803, i.e. remains substantially equal to 0.005 volts, for the first procedure ('MIN/MAX'). These results can be confirmed by experimental verification.

In summary, the embodiments of the invention described herein allow accurate estimation of DC errors, amplitude error and phase error over a wide dynamic range. The ability in the embodiments of the invention described herein to shift between two distinct algorithms used in the first and second procedures, e.g. in steps 311 and 313 of the method 300, allows the advantages of each of the first and second procedures to be obtained depending on received signal quality. Furthermore, in the embodiments of the invention the error estimation is not dependent as in the prior art on (i) modulation characteristics of the received FM signal or on (ii) the need to detect and correct for any frequency error between the carrier frequency of the received signal and the frequency of a local oscillator signal applied to obtain the signal. This results in an algorithm convergence speed, i.e. a speed to reach an error estimation result, which is quicker than that of the prior art.

Although the present invention has been described in terms of the above embodiments, especially with reference to the accompanying drawings, it is not intended to be limited to the specific form described in such embodiments. Rather, the scope of the present invention is limited only by the accompanying claims. In the claims, the terms 'comprising' or 'including' do not exclude the presence of other integers or steps. Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. In addition, singular references do not exclude a plurality. Thus references to "a", "an", "first", "second" etc do not preclude a plurality.

The invention claimed is:

1. A wireless receiver for receiving and demodulating a frequency modulated RF (radio frequency) signal by a direct conversion procedure, including channels for producing and processing in-phase and quadrature phase components of the received signal, and a processor for periodically estimating an error in at least one of the in-phase and quadrature phase components and for producing a signal to adjust at least one of the in-phase and quadrature phase components to compensate for the estimated error, wherein the processor is operable to form blocks of discrete samples of data derived from at least one of an in-phase component or a quadrature phase component of the received RF signal and to apply in estimating the error alternatively each of a plurality of different procedures to estimate the error, the procedures including:

a first procedure applied when a signal quality value of the received RF signal is above a threshold value, which includes estimating, for each of the blocks, a maximum value and a minimum value of the discrete samples of the block and estimating a mean only of the maximum and minimum values; and a second procedure, applied when a signal quality value of the received RF signal is not above the threshold value, which includes estimating, for each of the blocks, a sum of the values of all discrete samples of the block and dividing the sum by the total number of discrete samples in the block to provide a mean value over all samples in the block.

2. A receiver according to claim 1 including a signal quality estimator operably coupled to the processor to provide to the processor a measurement of current signal quality of the received RF signal, and the processor is operable in response to receiving the measurement to select a procedure for estimating the error.

3. A receiver according to claim 1 wherein the signal quality estimator is operable to measure a RSSI (received signal strength indication) of the received RF signal and the processor is operable to apply the first procedure when the received RF signal has a measured RSSI value above a threshold RSSI value of −95 dBm (ninety five decibels lower than one milliWatt in a fifty ohm RF system).

4. A receiver according to claim 1 wherein the signal quality estimator is operable to measure a signal to noise ratio of the received RF signal and the processor is operable to apply the first procedure when the received signal has a measured value of signal to noise greater than a threshold value of signal to noise ratio of thirty five decibels.

5. A receiver according to claim 1 the processor is operable to estimate alternatively by the first procedure and the second procedure a block value for a block of discrete samples of data derived from each of the in-phase component and the quadrature phase component of the received RF signal.

6. A receiver according to claim 1 wherein the processor is operable to estimate a DC offset error of the in-phase component or the quadrature phase component of the received RF signal and to issue a signal to provide an adjustment to compensate for the estimated DC offset error.

7. A receiver according to claim 6 wherein the processor is operable to employ in the first procedure and optionally in the second procedure consecutive blocks of $n_1$ discrete samples, where $n_1$ is a number between three hundred and seven hundred.

8. A receiver according to claim 1 wherein the processor is operable to estimate a phase error consisting of an error in a relative difference in phase between the in-phase and quadrature phase components of the received RF signal and to issue a signal to provide an adjustment to compensate for the estimated phase error.

9. A receiver according to claim 8 wherein the processor is operable to employ for phase error estimation consecutive blocks of $n_2$ discrete samples, where $n_2$ is a number between one thousand and three thousand.

10. A receiver according to claim 8 wherein the block of samples to which the first or second procedure is applied for phase error estimation comprises a block of samples of multiplication products of discrete samples of the in-phase component and corresponding discrete samples of the quadrature phase component.

11. A receiver according to claim 1 wherein the processor is operable to estimate an amplitude error which is an error in a relative ratio in amplitude between the in-phase and quadrature phase components of the received RF signal and to issue a signal to provide an adjustment to compensate for the estimated amplitude error.

12. A receiver according to claim 9 wherein the processor is operable to employ for amplitude error estimation consecutive blocks of $n_3$ discrete samples, where $n_3$ is a number between three thousand and five thousand.

13. A receiver according to claim 9 wherein the processor is operable to estimate alternatively by the first procedure and the second procedure a block value for a block of data derived from discrete samples of each of the in-phase component and the quadrature phase component of the received signal, wherein each of the blocks comprises a block of squares of values of the discrete samples.

14. A receiver according to claim 1 wherein in the first procedure and optionally in the second procedure the discrete samples are formed at a rate of between ten thousand and thirty thousand discrete samples per minute.

15. A receiver according to claim 1 wherein the processor is operable to apply a data validity checking procedure to determine if data representing discrete samples to be included in or converted into a block of data to which the first procedure is to be applied is valid for use in the first procedure.

16. A receiver according to claim 15 wherein the processor is operable to apply the block of data to a buffer for further processing only if the block of data is found to be valid.

17. A receiver according to claim 15 wherein the processor is operable to apply the data validity checking procedure to data samples of the in-phase component, or of the quadrature phase component, of the received RF signal.

18. A receiver according to claim 15 wherein the processor is operable to apply the data validity checking procedure to check that no sudden change in signal quality has occurred.

19. A receiver according to claim 18 wherein the processor is operable to apply a data validity checking procedure which includes determining, for a block of data having sets of samples V1 and V2 in the data block, if both Conditions 1 and 2 defined as follows are met:

Condition 1: the value of Delta 1 is between the value of T2·Delta 2 and the value of T1·Delta 2; where T2 and T1 are predetermined multipliers, ·represents a multiplication operation, Delta 1 is the difference between the maximum and minimum values of data in the set V1 and Delta 2 is the difference between the maximum and minimum values of data in the set V2 block; and Condition 2: the value of $V1_{max}$ is between the value of $T2 \cdot V2_{max}$ and the value of $T1 \cdot V2_{max}$ where T1, T2 and · are as in Condition 1 and $V1_{max}$ is the maximum value of the set V1 and $V2_{max}$ is the maximum value of the set V2.

20. A receiver according to claim 15 wherein the processor is operable to apply the data validity checking procedure to samples of the in-phase component, and to samples of the quadrature phase component, of the received RF signal.

21. A receiver according to claim 20 wherein the processor includes a plurality of estimators operable to estimate at least two of:

(i) a DC error in the in-phase component;

(ii) a DC error in the quadrature phase component;

(iii) an error in phase between the in phase component and the quadrature phase component; and (iv) an error in amplitude ratio between the in-phase component and the quadrature phase component; and the processor is operable to apply each block of data found to be valid for further processing by one or more of the plurality of estimators.

22. A receiver according to claim 21 wherein the processor includes, for use in association with each of the estimators, a selector which selects the first or second procedure for use in the estimator based upon a signal quality value of the received RF signal.

23. A method of operation in a wireless receiver for receiving and demodulating a frequency modulated RF (radio frequency) signal by a direct conversion procedure, including producing in-phase and quadrature phase components of a received RF signal, periodically estimating an error in at least one of the in-phase and quadrature components and applying an adjustment to at least one of the in-phase and quadrature components to compensate for the estimated error, including in estimating the error the steps of: forming blocks of discrete samples of data derived from at least one of an in-phase component and a quadrature phase component of the received RF signal; and applying alternatively each of a plurality of different data processing procedures to process each of the blocks, the procedures including: a first procedure, applied when a signal quality value of the RF received signal is above a threshold value, which includes estimating a maximum value and a minimum value of the discrete samples of the block and estimating a mean only of the maximum and minimum values; and a second procedure, applied when a signal quality value of the RF received signal is not above the threshold value, which includes estimating a sum of the values of all discrete samples in a block of samples of data derived from an in-phase component or from a quadrature phase component of the received RF signal and dividing the sum by the total number of discrete samples in the block to provide a mean value over all samples in the block.

* * * * *

UNITED STATES PATENT AND TRADEMARK OFFICE
CERTIFICATE OF CORRECTION

| | | |
|---|---|---|
| PATENT NO. | : 7,817,980 B2 | Page 1 of 1 |
| APPLICATION NO. | : 11/736898 | |
| DATED | : October 19, 2010 | |
| INVENTOR(S) | : Corse et al. | |

It is certified that error appears in the above-identified patent and that said Letters Patent is hereby corrected as shown below:

In Column 1, Line 52, delete "the" and insert -- claim 23 of the --, therefor.

In Column 15, Line 1, in Claim 5, delete "the" and insert -- wherein the --, therefor.

Signed and Sealed this
Thirty-first Day of July, 2012

David J. Kappos
*Director of the United States Patent and Trademark Office*